United States Patent [19]

Nishizawa et al.

[11] Patent Number: 5,296,403

[45] Date of Patent: Mar. 22, 1994

[54] METHOD OF MANUFACTURING A STATIC INDUCTION FIELD-EFFECT TRANSISTOR

[75] Inventors: Jun-ichi Nishizawa; Toru Kurabayashi, both of Sendai, Japan

[73] Assignees: Research Development Corp. of Japan, Tokyo; Jun-ichi Nishizawa, Miyagi; Zaidan Hojin Handotai Kenkyu Shinkokai, Miyagi, all of Japan

[21] Appl. No.: 965,722

[22] Filed: Oct. 23, 1992

[51] Int. Cl.$^5$ .................................. H01L 21/20
[52] U.S. Cl. ............................ 437/133; 437/909; 437/911; 437/913
[58] Field of Search ............... 437/133, 107, 126, 90, 437/909, 911, 913

[56] References Cited

U.S. PATENT DOCUMENTS

| | | | |
|---|---|---|---|
| 3,865,625 | 2/1975 | Cho et al. | 437/133 |
| 4,473,598 | 9/1984 | Ephrath et al. | 437/90 |
| 4,642,144 | 2/1987 | Tiedje et al. | 437/913 |
| 4,713,358 | 12/1987 | Bulat et al. | 437/911 |
| 4,883,770 | 11/1989 | Dohler et al. | 437/133 |
| 5,106,770 | 4/1992 | Bulat et al. | 437/911 |
| 5,180,684 | 1/1993 | Fujioka | 437/126 |
| 5,236,863 | 8/1993 | Iranmanesh | 437/90 |

FOREIGN PATENT DOCUMENTS

2068168  8/1981  United Kingdom .............. 437/909

*Primary Examiner*—Brian E. Hearn
*Assistant Examiner*—Linda J. Fleck
*Attorney, Agent, or Firm*—Fish & Richardson

[57] ABSTRACT

A semiconductor device comprises a vertical MIS-SIT which has a smaller source-to-drain distance for operation at ultra-high speed. The semiconductor device has a substrate crystal for epitaxial growth thereon, least two semiconductor regions of different conductivity types deposited by way of epitaxial growth on the substrate crystal according to either metal organic chemical vapor deposition (MO-CVD) or molecular layer epitaxy (MLE), thereby providing a source-drain structure, a gate side formed by etching the semiconductor regions of the source-drain structure, the gate side comprising either a (111)A face or a (111)B face, and a semiconductor region deposited as a gate by way of epitaxial growth on the gate side according to either MO-CVD or MLE.

4 Claims, 10 Drawing Sheets

METHOD OF MANUFACTURING A STATIC INDUCTION FIELD-EFFECT TRANSISTOR

BACKGROUND OF THE INVENTION

1. Field of the Invention

The present invention relates to a semiconductor device comprising a high-speed static induction transistor, and a method of manufacturing such a semiconductor device.

2. Description of the Prior Art

Known field-effect transistors include junction and MIS (Metal Insulator Semiconductor) field-effect transistors. The junction and MIS field-effect transistors exhibit saturated current vs. voltage characteristics in which the drain current is gradually saturated as the drain voltage increases.

Static induction field-effect transistors (hereinafter also referred to as "SIT") whose drain current continues to increase as the drain voltage increases are disclosed in Japanese patent publication No. 52-6076 entitled "Field-effect transistor" and Japanese patent publication No. 52-17720 entitled "Field-effect transistor."

The SITs are better than field-effect transistors (hereinafter also referred to as "FET") as they are characterized by a large power-handling capability, a high dielectric strength, a large current-handling capacity, a low distortion, a low noise level, low power consumption, and high-speed operation. The SITs are also much better than conventional bipolar transistors and FETs with respect to temperature characteristics.

Since the SITs have proven highly satisfactory as discrete elements and IC components, they are finding growing use in various new applications.

In the case where a logic gate is to be constructed of SITs, normally-off SITs which do not pass a current when no bias is applied to their gates are suitable for use as such logic gate elements. Normally-off SITs with pn-junction gates undergo the injection of minority carriers as the gates are successively biased. Accumulation of such minority carriers makes the normally-off SITs difficult to operate at high speed.

SUMMARY OF THE INVENTION

In view of the aforesaid drawbacks of the conventional semiconductor devices, it is an object of the present invention to provide a semiconductor device which is composed of a vertical MIS-SIT with a short source-to-drain distance, is capable of ultra-high-speed operation, and is of a low power requirement.

Another object of the present invention is to provide a method of manufacturing such a semiconductor device.

According to the present invention, there is provided a method of manufacturing a semiconductor device, comprising the steps of depositing at least two semiconductor regions of different conductivity types by way of epitaxial growth on a substrate crystal according to either metal organic chemical vapor deposition or molecular layer epitaxy, thereby providing a source-drain structure, etching the semiconductor regions to form a gate side which comprises either a (111)A face or a (111)B face, and depositing a semiconductor region as a gate by way of epitaxial growth on the gate side according to either metal organic chemical vapor deposition or molecular layer epitaxy.

According to the present invention, there is also provided a semiconductor device comprising a substrate crystal for epitaxial growth thereon, least two semiconductor regions of different conductivity types deposited by way of epitaxial growth on the substrate crystal according to either metal organic chemical vapor deposition or molecular layer epitaxy, thereby providing a source-drain structure, a gate side formed by etching the semiconductor regions of the source-drain structure, the gate side comprising either a (111)A face or a (111)B face, and a semiconductor region deposited as a gate by way of epitaxial growth on the gate side according to either metal organic chemical vapor deposition or molecular layer epitaxy.

Since p and n− layers of the semiconductor device are formed according to the molecular layer epitaxy (MLE) process, the thicknesses of these layers can be controlled highly accurately in increments of a single molecular layer. The p layer is of such a small thickness that the semiconductor device exhibits SIT characteristics.

The semiconductor device is capable of high-speed operation as the channel is shorter than the mean free path of electrons and the electrons injected from the source electrode travel without being dispersed by the crystal lattice.

The thickness of the p layer may be reduce to several Å according to the MLE process.

An insulating layer, which serves as an insulator layer in an MIS structure, can be of a highly uniform, ultra-thin-film structure according to the metal organic chemical vapor deposition (MO-CVD) process. Therefore, the semiconductor device can serve as an ultra-high-speed SIT of a low power requirement.

The above and other objects, features, and advantages of the present invention will become apparent from the following description when taken in conjunction with the accompanying drawings which illustrate preferred embodiments of the present invention by way of example.

Figure 6:
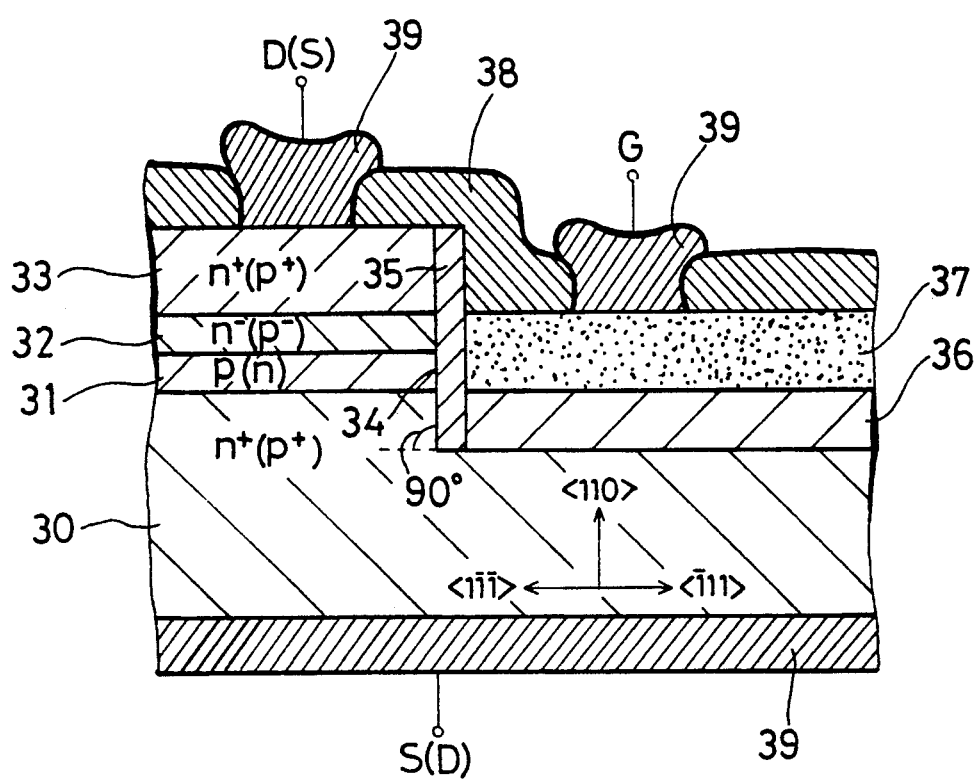
Figure 7A:
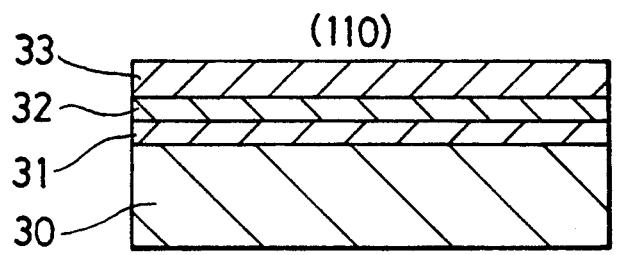
Figure 7B:
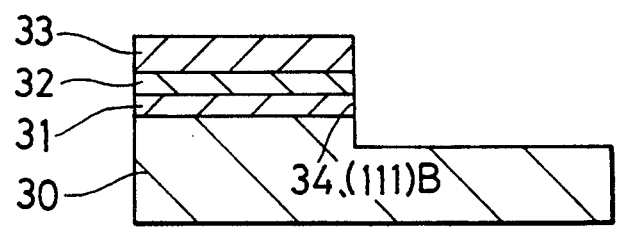
Figure 7C:
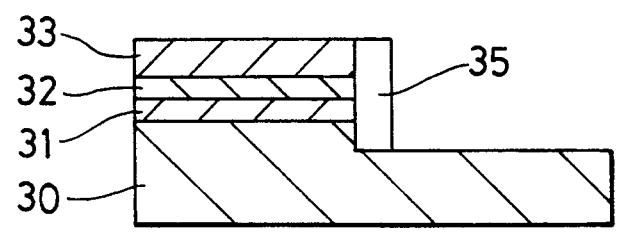
Figure 7D:
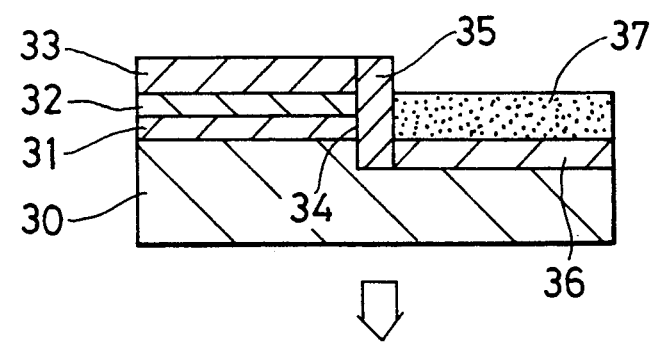
Figure 8:
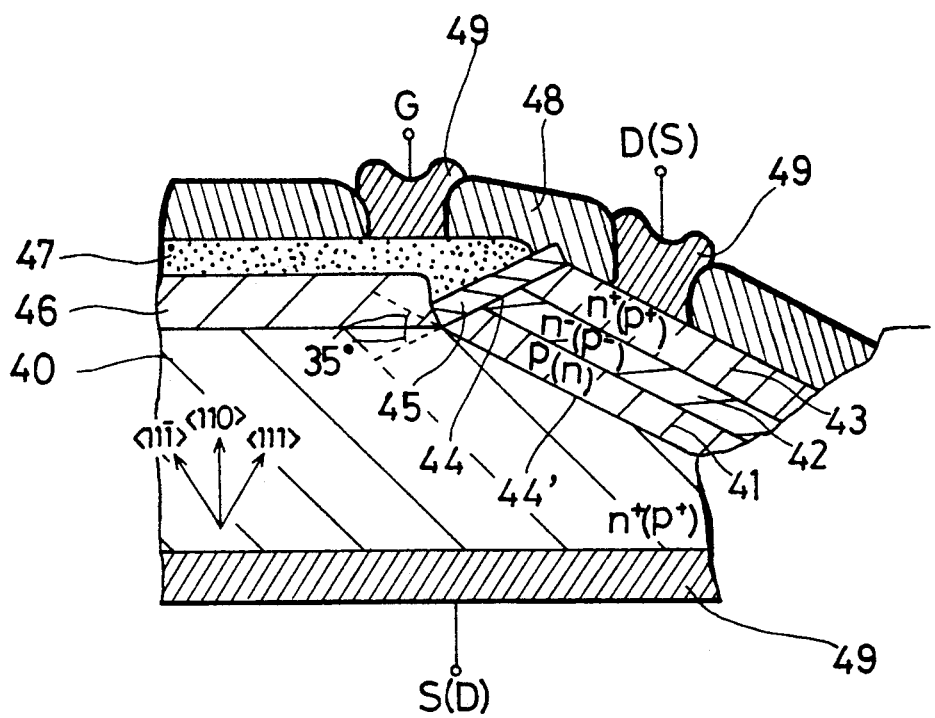
Figure 9A:
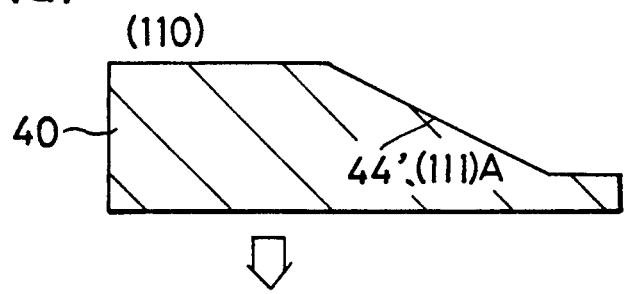
Figure 9B:
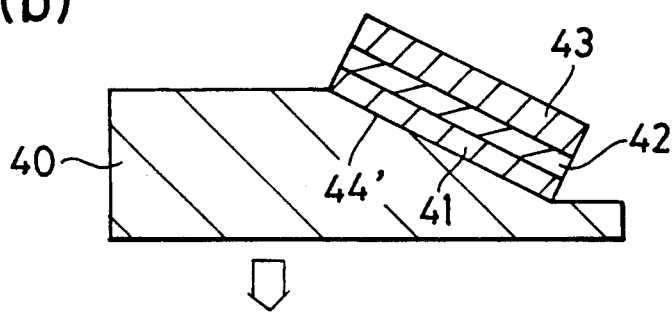

5(d) being a diagram illustrative of MO-CVD and the formation of a gate electrode;

FIG. 6 is a fragmentary cross-sectional view of a vertical MIS-SIT as a semiconductor device according to a third embodiment of the present invention;

FIGS. 7(a) through 7(d) show a process of manufacturing the semiconductor device according to the third embodiment, FIG. 7(a) being a diagram illustrative of an epitaxial growth process according to MO-CVD, FIG. 7(b) being a diagram illustrative of an etching process, FIG. 7(c) being a diagram illustrative of an epitaxial growth process according to MLE, and FIG. 7(d) being a diagram illustrative of MO-CVD and the formation of a gate electrode;

FIG. 8 is a fragmentary cross-sectional view of a vertical MIS-SIT as a semiconductor device according to a fourth embodiment of the present invention;

FIGS. 9(a) through 9(e) show a process of manufacturing the semiconductor device according to the fourth embodiment, FIG. 9(a) being a diagram illustrative of an etching process; FIG. 9(b) being a diagram illustrative of an epitaxial growth process according to MO-CVD, FIG. 9(c) being a diagram illustrative of an etching process, FIG. 9(d) being a diagram illustrative of an epitaxial growth process according to MLE, and FIG. 9(e) being a diagram illustrative of MO-CVD and the formation of a gate electrode; and FIG. 10 is a fragmentary cross-sectional view of a vertical MIS-SIT as a semiconductor device according to a fifth embodiment of the present invention.

DETAILED DESCRIPTION OF THE PREFERRED EMBODIMENTS

Figure 1A:
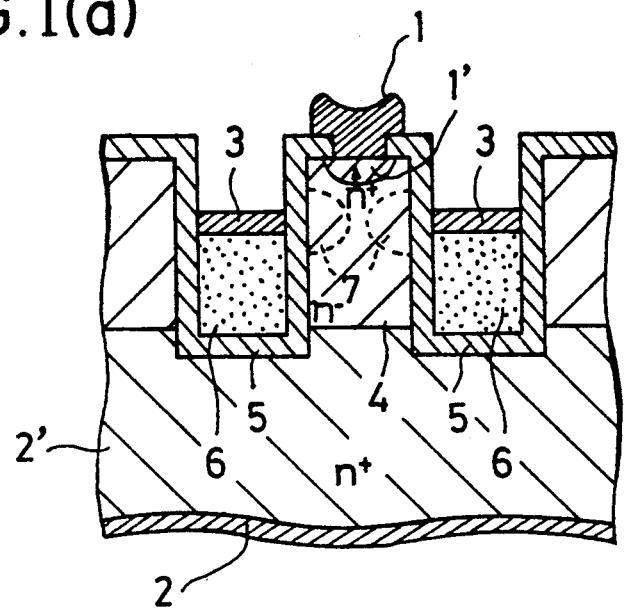
FIGS. 1(a) and 1(b) are fragmentary cross-sectional views showing a conceptual representation of vertical MIS-SITs as a semiconductor device according to the present invention.
Figure 1B:
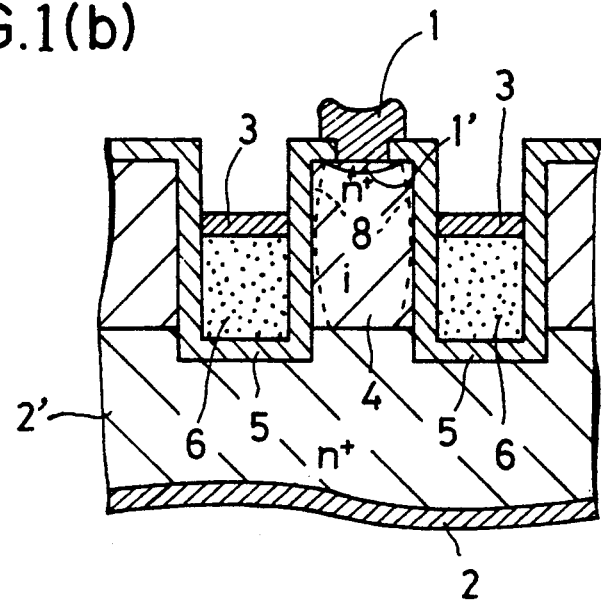

FIGS. 1(a) and 1(b) show a conceptual representation of vertical MIS-SITs as a semiconductor device according to the present invention.

Specifically, FIG. 1(a) illustrates a depletion-layer-type vertical MIS-SIT having gate electrodes 3 to which a voltage is applied to control the spreading of depletion layers 7.

FIG. 1(b) illustrates an inversion-layer-type vertical MIS-SIT having gate electrodes 3 to which a voltage is applied to control the spreading of inversion layers 8.

In each of FIGS. 1(a) and 1(b), the vertical MIS-SIT includes source, drain, and gate electrodes 1, 2, 3, an n+ layer 1', an n+ layer 2', an n− or i layer 4, insulating films 5, and insulators 6.

In each of the vertical MIS-SITs shown in FIGS. 1(a) and 1(b), electrons injected from the source electrode 1 are controlled in their travel by a potential barrier that is developed between the source electrode 1 and the drain electrode 2 by a voltage applied to the gate electrodes 3 on the insulating films 5.

The above semiconductor device is capable of high-speed operation as the channel is shorter than the mean free path of electrons and the electrons injected from the source electrode 1 travel without being dispersed by the crystal lattice.

The semiconductor device shown in FIGS. 1(a) and 1(b) is manufactured as follows:

The manufacturing process employs metal organic chemical vapor deposition (MO-CVD) and molecular layer epitaxy (MLE) for crystal growth, and photo-excited gas etching and wet etching for forming gate sides.

The MO-CVD process is a process in which both a metal organic gas of an element of group III and a hydride gas of an element of group V are simultaneously supplied as a carrier gas onto a substrate crystal for crystal growth in a reaction tube under reduced or normal pressure.

According to the MO-CVD process, the crystal growth rate is maximum on the (111)A face of a sphalerite crystal used as the substrate, and no crystal growth occurs on the (111)B face thereof.

The MO-CVD process has an excellent film thickness control capability, and, in fact, can control the film thickness to the accuracy of about 10 Å.

The MLE process is a process in which a metal organic gas of an element of group III and a hydride gas of an element of group V are alternately supplied onto a substrate crystal which is heated in vacuum, for crystal growth in increments of a single molecular layer. One example of the MLE process is reported in an article written by J. Nishizawa, H. Abe, and T. Kurabayashi in J. Electrochem. Soc., No. 132 (1985), pages 1197~1200.

The MLE process is based on the adsorption and surface reaction of the compound gases and is capable of producing a single molecular growth layer upon introduction of one influx of the group-III compound gas and one influx of the group-V compound gas.

According to the MLE process, no crystal growth takes place on the (111)A face and (110) face of the sphalerite crystal used as the substrate, and crystal growth in increments of a single molecular layer is possible on the (111)B face and (100) face of the sphalerite crystal.

Anisotropy of the crystal growth according to the MO-CVD and MLE processes is given in Table 1 below:

TABLE 1

| Crystal growth process | $R_{(111)B}/R_{(111)A}$ | Remarks |
| --- | --- | --- |
| MO-CVD | $<10^{-3}$ | $R_{(111)A} \approx 400$ Å/min. |
| | | $R_{(111)B} = 0$ |
| MLE | $>10^{+3}$ | $R_{(111)B} = 3.26$ Å/cycle($\approx 10$ Å/min.) |
| | | $R_{(111)A} = 0$ |
| | | $R_{(110)} = 0$ |

In Table 1, $R_{(111)B}$ is the growth rate on the (111)B face, and $R_{(111)A}$ the growth rate on the (111)A face.

As described above, the photo-excited gas etching process and the wet etching process are employed for forming gate sides.

According to the photo-excited gas etching process, a sphalerite crystal which has been patterned with a film of SiN, $SiO_2$, or the like is kept at a certain temperature in vacuum, and a gas of $Br_2$, $Cl_2$, $PCl_3$, $CCl_3F$, or the like is introduced so that it has a predetermined partial pressure. Then, an ultraviolet radiation emitted from a high-pressure mercury-vapor lamp or an excimer laser is applied to the sphalerite crystal to etch the exposed area thereof.

In the photo-excited gas etching process, the sphalerite crystal may be etched without exposure to the ultraviolet radiation. According to the photo-excited gas etching process, however, the etching rate largely differs between the (111)A face and the (111)B face irrespective of whether the sphalerite crystal is exposed to the ultraviolet radiation or not.

For example, in the case where a gas of $Br_2$ or $Cl_2$ is employed, the etching rates R are related such that $R_{(111)A} << R_{(111)B}$, and in the case where a gas of $PCl_3$ or CCl₃F is employed, the etching rates R are related such that $R_{(111)A} \gg R_{(111)B}$.

The wet etching process employs a solution of bromethanol, a solution of phosphoric acid, hydrogen peroxide, and water, a solution of iodine, potassium iodide, and glycerine, or a solution of sulfuric acid, hydrogen peroxide, and water.

Table 2 below shows anisotropy of the above etching processes.

TABLE 2

| Process | Etchant | $R'_{(111)B}/R'_{(111)A}$ | Remarks |
|---|---|---|---|
| Photo-excited gas etching | Br₂ | >10³ | $R_{(111)B} \approx$ 5000 Å/min. |
| | Cl₂ | >10³ | $R_{(111)B} \approx$ 4000 Å/min. |
| | CCl₃F | <10⁻³ | $R_{(111)A} \approx$ 50 Å/min. |
| | PCl₃ | <10⁻³ | $R_{(111)A} \approx$ 50 Å/min. |
| | SiCl₄ | <10⁻³ | $R_{(111)A} \approx$ 50 Å/min. |
| | POCl₃ | <10⁻³ | $R_{(111)A} \approx$ 50 Å/min. |
| Wet etching | Bromethanol | >10³ | $R_{(111)B} \approx$ 2000 Å/min. |
| | Phosphoric acid + H₂O₂ + water | >10³ | $R_{(111)B} \approx$ 200 Å/min. |
| | Iodine + Potassium iodide + Glycerin | <10⁻³ | $R_{(111)A} \approx$ 1000 Å/min. |
| | Sulfuric acid + H₂O₂ + water | >10² | $R_{(111)B} \approx$ 2000 Å/min. |

In Table 2, $R'_{(111)B}$ indicates the etching rate on the (111)B face, and $R'_{(111)A}$ indicates the etching rate on the (111)A face.

Various vertical MIS-SITs which are fabricated according to the above crystal growth and etching processes will be described below.

Figure 2:
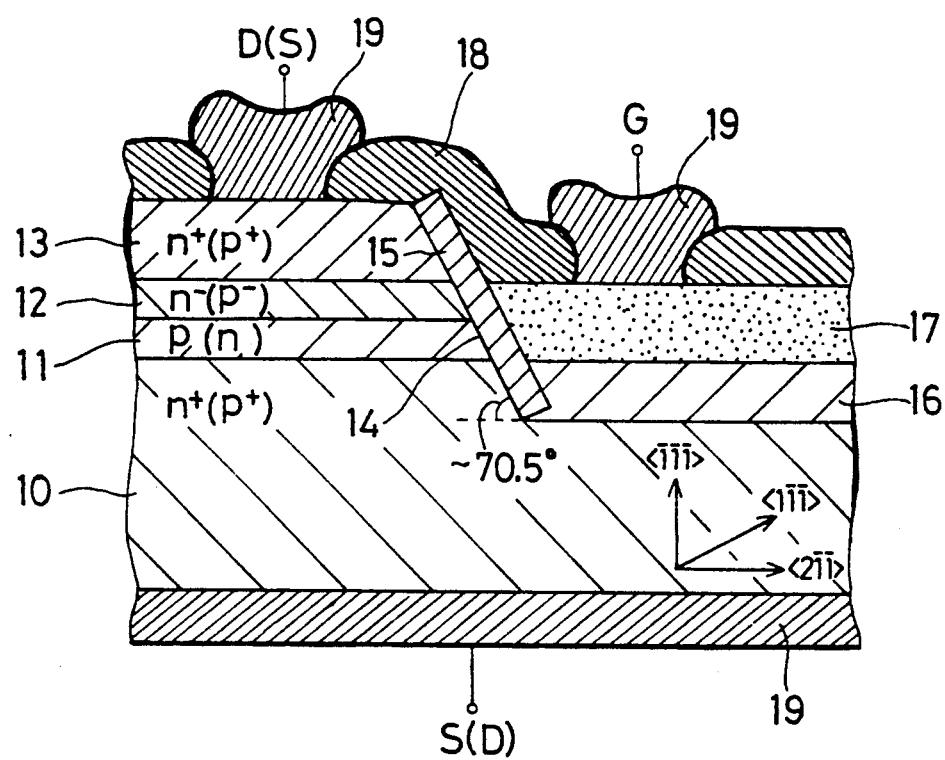
FIG. 2 is a fragmentary cross-sectional view of a vertical MIS-SIT as a semiconductor device according to a first embodiment of the present invention.

FIG. 2 shows a vertical MIS-SIT as a semiconductor device according to a first embodiment of the present invention, the vertical MIS-SIT using a (111)B face as a substrate crystal face. FIGS. 3(a) through 3(d) show a process of manufacturing the semiconductor device according to the first embodiment.

The structure of the vertical MIS-SIT shown in FIG. 2 will be described below in connection with the manufacturing process shown in FIGS. 3(a) through 3(d).

Figure 3A:
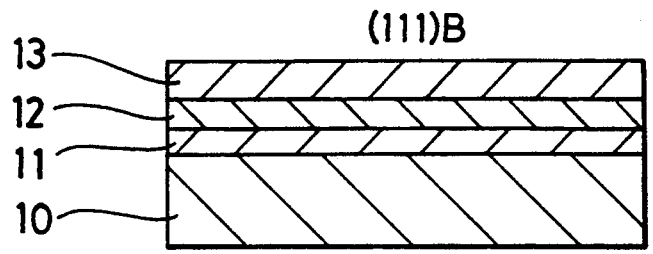
FIGS. 3(a) through 3(d) show a process of manufacturing the semiconductor device according to the first embodiment, FIG. 3(a) being a diagram illustrative of an epitaxial growth process according to MLE, FIG. 3(b) being a diagram illustrative of an etching process, FIG. 3(c) being a diagram illustrative of an epitaxial growth process according to MO-CVD, and FIG. 3(d) being a diagram illustrative of MLE and the formation of a gate electrode.

As shown in FIG. 3(a), a substrate crystal 10 comprises an n⁺ (111)B face that is highly doped with impurities, i.e., of a high impurity density, and a p layer (or i layer) 11, an n⁻ layer 12, and an n⁺ layer 13 are successively deposited to predetermined thicknesses on the substrate crystal 10 according to the MLE process, thereby producing an S (source) - D (drain) structure.

The n⁻ layer 12 and the p layer (or n layer) 11 may be switched around, and the n- and p-type layers in the above structure may be formed of p- and n-type materials, respectively.

Figure 3B:
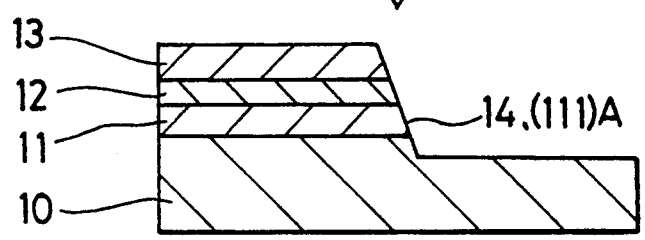

Thereafter, as shown in FIG. 3(b), an etching protective film is formed on the D (drain) or S (source) using a mask pattern, and a gate side 14 which comprises a (111)A face is formed by the photo-excited gas etching or wet etching process. The etching process used to etch the (111)A face is selected such that the etching rate is higher on the (111)B face and lower on the (111)A face. The etching process may be the photo-excited gas etching process using Br₂ or Cl₂ or the wet etching process using a solution of bromethanol, a solution of phosphoric acid, H₂O₂, and water, or a solution of sulfuric acid, H₂O₂, and water, as shown in Table 2 above.

Figure 3C:
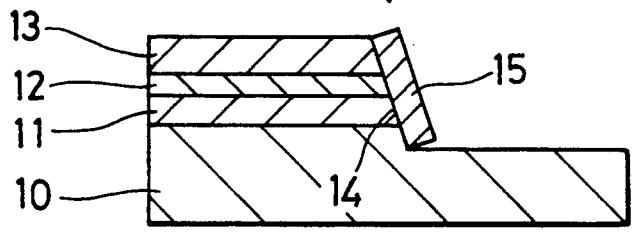

Then, as shown in FIG. 3(c), an insulating layer 15 is deposited on the gate side 14 according to the MO-CVD process.

The insulating layer 15 is formed of a semiconductor material which has a wider band gap than the semiconductor materials of the substrate crystal 10, the p layer (or n layer) 11, the n⁻ layer 12, and the n⁺ layer 13. The insulating layer 15 serves as an insulator layer in an MIS structure. According to the MO-CVD process, since the growth rate on the (111)B face is 0 as shown in Table 1 above and only the (111)B face and the (111)A face are exposed on the substrate surface, a crystal is grown only on the (111)A face.

Figure 3D:
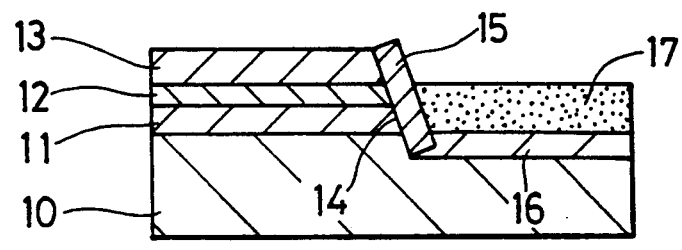

Subsequently, as shown in FIG. 3(d), an insulating layer 16 is deposited on the substrate crystal 10 according to the MLE process.

According to the MLE process, a crystal is grown only on the (111)B face. With the surface of the n⁺ layer 13 being covered with an SiN film or an SiO₂ film, no insulating material is deposited on the SiN film or the SiO₂ film by the MLE process.

After the insulating layer 16 has been deposited, an MIS gate electrode 17 is deposited on the insulating layer 16. The insulating layer 16 is effective to reduce the gate parasitic capacitance between the gate electrode 17 and the substrate crystal 10.

Then, as shown in FIG. 2, an insulating layer 18 is deposited, and then source, drain, and gate electrodes 19 are deposited, thus completing the vertical MIS-SIT.

The transistor according to the first embodiment exhibits SIT characteristics because the MLE process employed to form the p layer 11 and the n⁻ layer 12 is capable of controlling the thicknesses of these layers highly accurately in increments of a single molecular layer, and the p layer 11 is of a small thickness.

In the case where the thickness of the p layer 11 is several 100 Å or less, electrons injected from the S (source) are not dispersed by the crystal lattice, but reach the D (drain) at a thermal velocity. Consequently, an ultra-high-speed transistor can be produced which has a cutoff frequency of T Hz (tera Hz: $10^{12}$ Hz).

Since the MLE process is employed to form the p layer 11, the thickness of the p layer 11 may be reduced down to several Å.

The insulating layer 15, which serves as an insulator layer in an MIS structure, can be of a highly uniform, ultra-thin-film structure according to the MO-CVD process. Therefore, the semiconductor device can serve as an ultra-high-speed SIT of a low power requirement.

Figure 4:
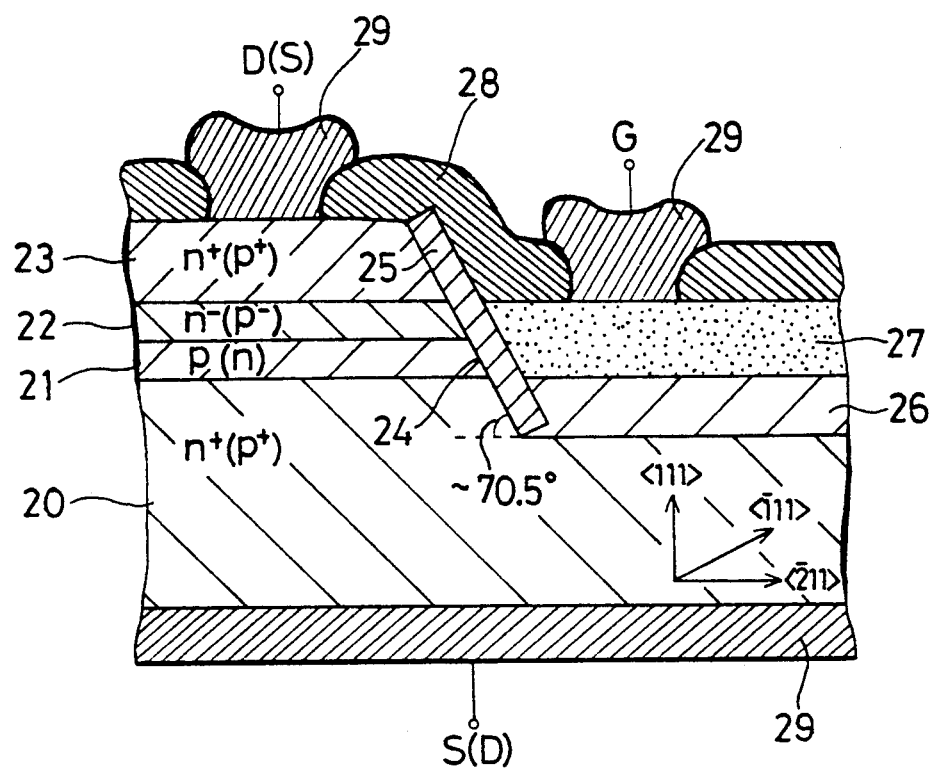
FIG. 4 is a fragmentary cross-sectional view of a vertical MIS-SIT as a semiconductor device according to a second embodiment of the present invention.

FIG. 4 shows a vertical MIS-SIT as a semiconductor device according to a second embodiment of the present invention, the vertical MIS-SIT using a (111)A face as a substrate crystal face. FIGS. 5(a) through 5(d) show a process of manufacturing the semiconductor device according to the second embodiment.

The structure of the vertical MIS-SIT shown in FIG. 4 will be described below in connection with the manufacturing process shown in FIGS. 5(a) through 5(d).

Figure 5A:
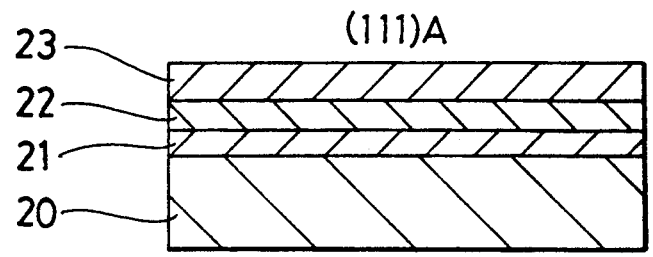
FIGS. 5(a) through 5(d) show a process of manufacturing the semiconductor device according to the second embodiment, FIG. 5(a) being a diagram illustrative of an epitaxial growth process according to MO-CVD, FIG. 5(b) being a diagram illustrative of an etching process, FIG. 5(c) being a diagram illustrative of an epitaxial growth process according to MLE, and FIG.

As shown in FIG. 5(a), a substrate crystal 20 comprises a highly doped n⁺ (111)A face, and a p layer (or i layer) 21, an n⁻ layer 22, and an n⁺ layer 23 are successively deposited to predetermined thicknesses on the substrate crystal 20 according to the MO-CVD process, thereby producing an S (source) - D (drain) structure.

The n⁻ layer 22 and the p layer (or n layer) 21 may be switched around, and the n- and p-type layers in the above structure may be formed of p- and n-type materials, respectively.

Figure 5B:
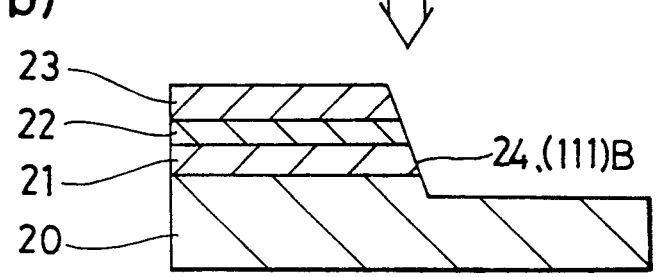

Thereafter, as shown in FIG. 5(b), an etching protective film is formed on the D (drain) or S (source) using a mask pattern, and a gate side 24 which comprises a (111)B face is formed by the photo-excited gas etching or wet etching process. The etching process used to etch the (111)B face is selected such that the etching rate is higher on the (111)A face and lower on the (111)B face. The etching process may be the photo-excited gas etching process using $CCl_3F$, $PCl_3$, $SiCl_4$, or $POCl_3$ or the wet etching process using a solution of iodine, potassium iodide, and glycerine, as shown in Table 2 above.

Figure 5C:
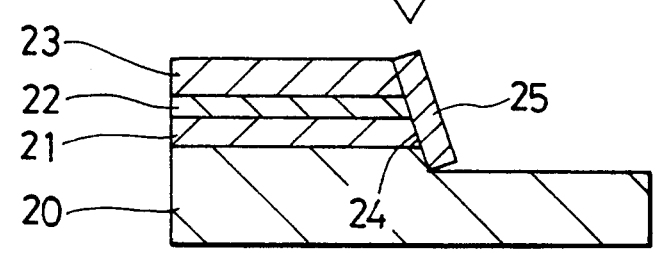

Then, as shown in FIG. 5(c), an insulating layer 25 is deposited on the gate side 24 according to the MLE process.

The insulating layer 25 is formed of a semiconductor material which has a wider band gap than the semiconductor materials of the substrate crystal 20, the p layer (or n layer) 21, the n⁻ layer 22, and the n⁺ layer 23. The insulating layer 25 serves as an insulator layer in an MIS structure. According to the MLE process, since the growth rate on the (111)A face is 0 as shown in Table 1 above and only the (111)A face and the (111)B face are exposed on the substrate surface, a crystal is grown only on the (111)B face.

Figure 5D:
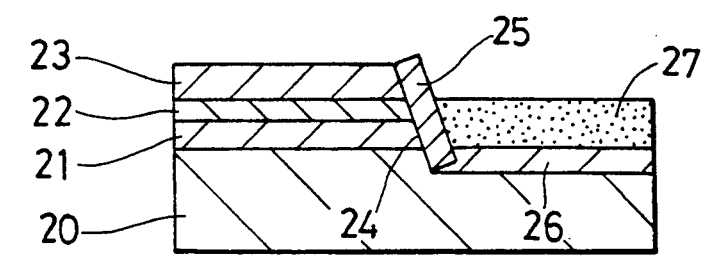

Subsequently, as shown in FIG. 5(d), an insulating layer 26 is deposited on the substrate crystal 20 according to the MO-CVD process. Then, an MIS gate electrode 27 is deposited on the insulating layer 26.

According to the MO-CVD process, a crystal is grown only on the (111)A face. With the surface of the n⁺ layer 23 being covered with an SiN film or an SiO₂ film, the insulating layer 26 can be deposited only in a given region by the MO-CVD process, as shown in FIG. 4.

Then, as shown in FIG. 4, an insulating layer 28 is deposited, and then source, drain, and gate electrodes 29 are deposited, thus completing the vertical MIS-SIT.

The transistor according to the second embodiment exhibits SIT characteristics because the MO-CVD process employed to form the p layer 21 and the n⁻ layer 22 is capable of controlling the thicknesses of these layers in increments of 10 Å, and the p layer 21 is of a small thickness.

Inasmuch as the thickness of the p layer 11 may be of several 100 Å or less, electrons injected from the S (source) are not dispersed by the crystal lattice, but reach the D (drain) at a thermal velocity. Consequently, an ultra-high-speed transistor can be produced which has a cutoff frequency of T Hz.

The insulating layer 25, which serves as an insulator layer in an MIS structure, can be of a highly uniform, ultra-thin-film structure according to the MLE process. Therefore, the semiconductor device can serve as an ultra-high-speed SIT of a low power requirement.

FIG. 6 shows a vertical MIS-SIT as a semiconductor device according to a third embodiment of the present invention, the vertical MIS-SIT using a (110) face as a substrate crystal face. FIGS. 7(a) through 7(d) show a process of manufacturing the semiconductor device according to the third embodiment.

The structure of the vertical MIS-SIT shown in FIG. 6 will be described below in connection with the manufacturing process shown in FIGS. 7(a) through 7(d).

As shown in FIG. 7(a), a substrate crystal 30 comprises a highly doped n⁺ (110) face, and a p layer (or i layer) 31, an n⁻ layer 32, and an n⁺ layer 33 are successively deposited to predetermined thicknesses on the substrate crystal 30 according to the MO-CVD process, thereby producing an S (source) - D (drain) structure.

The n⁻ layer 32 and the p layer (or n layer) 31 may be switched around, and the n- and p-type layers in the above structure may be formed of p- and n-type materials, respectively.

Thereafter, as shown in FIG. 7(b), an etching protective film is formed on the D (drain) or S (source) using a mask pattern, and a gate side 34 which comprises a (111)B face is formed by the photo-excited gas etching or wet etching process. The etching process used to etch the (111)B face is selected such that the etching rate is higher on the (111)A face and lower on the (111)B face. The etching process may be the photo-excited gas etching process using $CCl_3F$, $PCl_3$, $SiCl_4$, or $POCl_3$ or the wet etching process using a solution of iodine, potassium iodide, and glycerine, as shown in Table 2 above.

Then, as shown in FIG. 7(c), an insulating layer 35 is deposited on the gate side 34 according to the MLE process.

The insulating layer 35 is formed of a semiconductor material which has a wider band gap than the semiconductor materials of the substrate crystal 30, the p layer (or n layer) 31, the n⁻ layer 32, and the n⁺ layer 33. The insulating layer 35 serves as an insulator layer in an MIS structure. According to the MLE process, since the growth rate on the (111)A face is 0 as shown in Table 1 above and is also 0 on the (110) face, a crystal is grown only on the (111)B face, i.e., the gate side 34.

Subsequently, as shown in FIG. 7(d), an insulating layer 36 is deposited on the substrate crystal 30 according to the MO-CVD process. Then, an MIS gate electrode 37 is deposited on the insulating layer 36.

According to the MO-CVD process, a crystal is grown only on the (110) face. With the surface of the n⁺ layer 33 being covered with an SiN film or an SiO₂ film, the insulating layer 36 can be deposited only in a given region by the MO-CVD process, as shown in FIG. 6.

Then, as shown in FIG. 6, an insulating layer 38 is deposited, and then source, drain, and gate electrodes 39 are deposited, thus completing the vertical MIS-SIT.

The transistor according to the third embodiment exhibits SIT characteristics because the MO-CVD process employed to form the p layer 21 and the n⁻ layer 22 is capable of controlling the thicknesses of these layers in increments of 10 Å, and the p layer 31 is of a small thickness.

The thickness of the p layer 11 may be of several 100 Å or less. Thus, electrons injected from the S (source) are not dispersed by the crystal lattice, but reach the D (drain) at a thermal velocity. Consequently, an ultra-high-speed transistor can be produced which has a cutoff frequency of T Hz.

The insulating layer 35, which serves as an insulator layer in an MIS structure, can be of a highly uniform, ultra-thin-film structure according to the MLE process. Therefore, the semiconductor device can serve as an ultra-high-speed SIT of a low power requirement.

FIG. 8 shows a vertical MIS-SIT as a semiconductor device according to a fourth embodiment of the present invention, the vertical MIS-SIT using a (110) face as a substrate crystal face. FIGS. 9(a) through 9(e) show a process of manufacturing the semiconductor device according to the fourth embodiment.

The structure of the vertical MIS-SIT shown in FIG. 8 will be described below in connection with the manufacturing process shown in FIGS. 9(a) through 9(e).

As shown in FIG. 9(a), a substrate crystal 40 comprises a highly doped n+ (110) face, and a side 44' which comprises a (111)A face is formed by the photo-excited gas etching or wet etching process. The etching process used to etch the (111)A face is selected such that the etching rate is higher on the (111)B face and lower on the (111)A face. The etching process may be the photo-excited gas etching process using $Br_2$ or $Cl_2$ or the wet etching process using a solution of bromethanol, a solution of phosphoric acid, $H_2O_2$, and water, or a solution of sulfuric acid, $H_2O_2$, and water, as shown in Table 2 above.

Then, as shown in FIG. 9(b), a p layer (or i layer) 41, an n− layer 42, and an n+ layer 43 are successively deposited to predetermined thicknesses on the side 44' according to the MO-CVD process, thereby producing an S (source) - D (drain) structure.

The n− layer 42 and the p layer (or n layer) 41 may be switched around, and the n- and p-type layers in the above structure may be formed of p- and n-type materials, respectively.

Figure 9C:
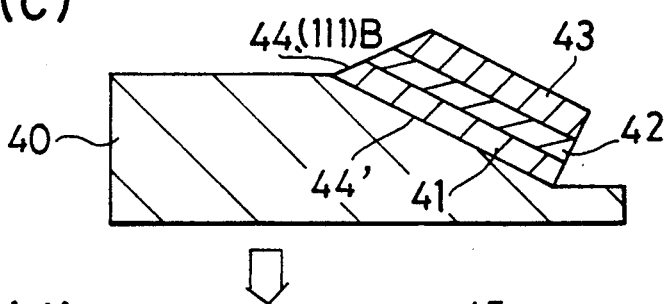
Figure 10:
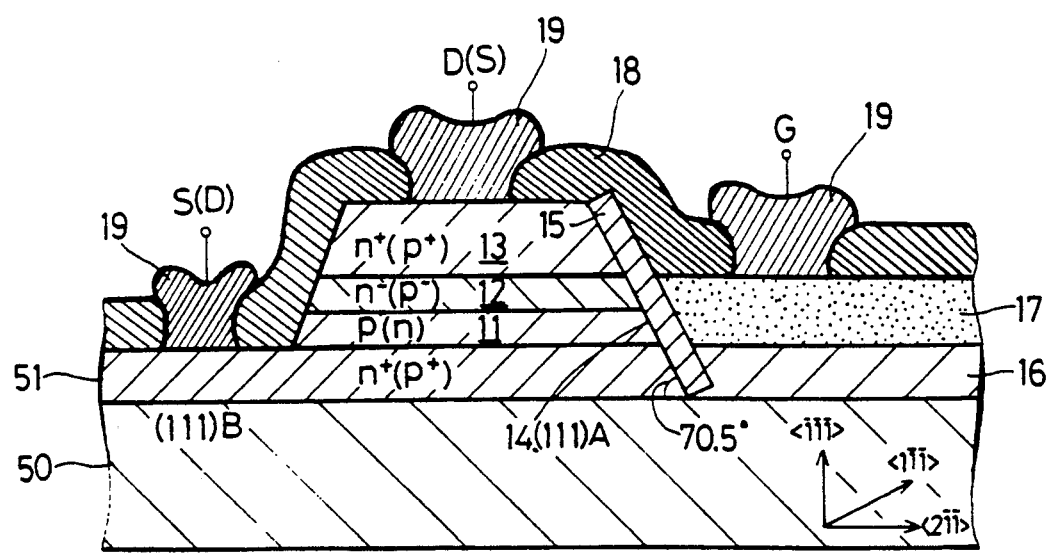

Thereafter, as shown in FIG. 9(c), an etching protective film is formed on the D (drain) or S (source) using a mask pattern, and a gate side 44 which comprises a (111)B face is formed by the photo-excited gas etching or wet etching process. The etching process used to etch the (111)B face is selected such that the etching rate is higher on the (111)A face and lower on the (111)B face. The etching process may be the photo-excited gas etching process using $CCl_3F$, $PCl_3$, $SiCl_4$, or $POCl_3$ or the wet etching process using a solution of iodine, potassium iodide, and glycerine, as shown in Table 2 above.

Figure 9D:
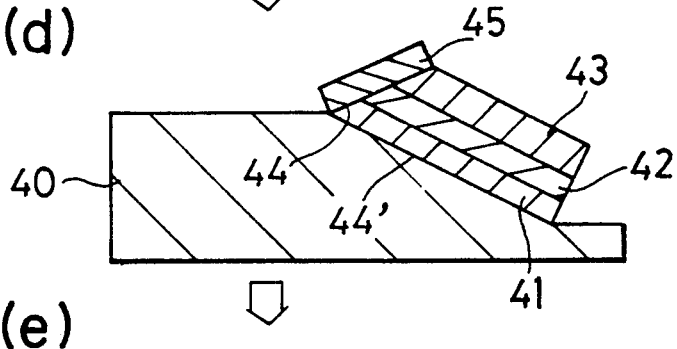

Then, as shown in FIG. 9(d), an insulating layer 45 is deposited on the gate side 44 according to the MLE process.

The insulating layer 45 is formed of a semiconductor material which has a wider band gap than the semiconductor materials of the substrate crystal 40, the p layer (or n layer) 41, the n− layer 42, and the n+ layer 43. The insulating layer 15 serves as an insulator layer in an MIS structure. According to the MLE process, since the growth rate on the (111)A face and the (110) face is 0 as shown in Table 1 above, a crystal is grown only on the (111)B face, i.e., the gate side 44.

Figure 9E:
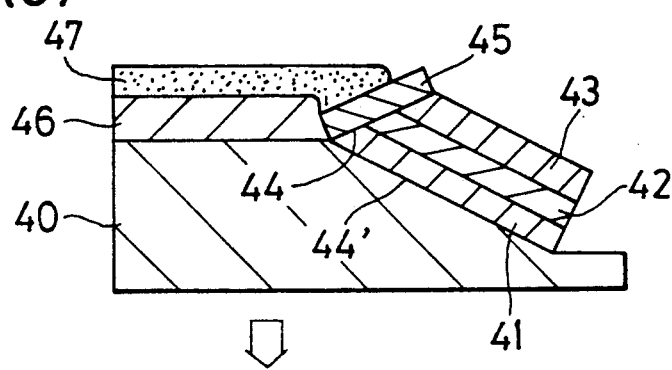

Subsequently, as shown in FIG. 9(e), an insulating layer 46 is deposited on the substrate crystal 40 according to the MO-CVD process, and then an MIS gate electrode 47 is deposited on the insulating layer 46.

According to the MO-CVD process, a crystal is grown only on the (110) face. With the surface of the n+ layer 43 being covered with an SiN film or an $SiO_2$ film, the insulating layer 46 can be deposited only in a given region by the MO-CVD process, as shown in FIG. 8.

Then, as shown in FIG. 8, an insulating layer 48 is deposited, and then source, drain, and gate electrodes 49 are deposited, thus completing the vertical MIS-SIT.

The transistor according to the fourth embodiment exhibits SIT characteristics because the MO-CVD process employed to form the p layer 41 and the n− layer 42 is capable of controlling the thicknesses of these layers in increments of 10 Å, and the p layer 41 is of a small thickness.

The thickness of the p layer 41 may be of several 100 Å or less. Thus, electrons injected from the S (source) are not dispersed by the crystal lattice, but reach the D (drain) at a thermal velocity. Consequently, an ultra-high-speed transistor can be produced which has a cut-off frequency of T Hz.

The insulating layer 45, which serves as an insulator layer in an MIS structure, can be of a highly uniform, ultra-thin-film structure according to the MLE process. Therefore, the semiconductor device can serve as an ultra-high-speed SIT of a low power requirement.

FIG. 10 shows a vertical MIS-SIT as a semiconductor device according to a fifth embodiment of the present invention, the vertical MIS-SIT using a semi-insulating (SI) substrate material as a substrate crystal. The vertical MIS-SIT shown in FIG. 9 is similar to the vertical MIS-SIT shown in FIG. 2 except that the SI substrate is used to minimize the floating capacitance of the gate.

The vertical MIS-SIT shown in FIG. 10 is manufactured as follows:

As shown in FIG. 10, a substrate crystal 50 comprises a (111)B face of an SI substrate material.

An n+ layer 51, a p layer (or i layer) 11, an n− layer 12, and an n+ layer 13 are successively deposited to predetermined thicknesses on the substrate crystal 50 according to the MLE process, thereby producing an S (source) - D (drain) structure.

The n− layer 12 and the p layer (or n layer) 11 may be switched around, and the n- and p-type layers in the above structure may be formed of p- and n-type materials, respectively.

Thereafter, an etching protective film is formed using a mask pattern, and a gate side 14 which comprises a (111)A face is formed by either the photo-excited gas etching using $Br_2$ or $Cl_2$, or the wet etching process using a solution of bromethanol, a solution of phosphoric acid, $H_2O_2$, and water, or a solution of sulfuric acid, $H_2O_2$, and water, as shown in Table 2 above.

Then, an insulating layer 15 is deposited only on the gate side 14 according to the MO-CVD process. The insulating layer 15 serves as an insulator layer in an MIS structure.

Subsequently, an insulating layer 16 is deposited on the substrate crystal 50 according to the MLE process, and then an MIS gate electrode 17 is deposited on the insulating layer 16.

Furthermore, an etching protective film is formed using a mask pattern, and the n+ layer 51 is exposed by etching in order to form a source or drain region.

Thereafter, an insulating layer 18 is deposited, and then source, drain, and gate electrodes 19 are deposited, thus completing the vertical MIS-SIT which employs a semi-insulating substrate material as a substrate crystal.

In the transistor according to the fifth embodiment, since the MLE process is employed to form the p layer 11 and the n− layer 12, the thicknesses of these layers can be controlled highly accurately in increments of a single molecular layer. The insulating layer 15, which serves as an insulator layer in an MIS structure, can be of a highly uniform, ultra-thin-film structure according to the MO-CVD process. Since the substrate crystal is of a semi-insulating nature, the capacitance between the gate electrode 17 and the substrate crystal 50 is held to a minimum. Accordingly, the vertical MIS-SIT can operate in a frequency band of T Hz.

The structure of FIG. 10 which employs a semi-insulating substrate crystal may be incorporated in the semiconductor devices shown in FIGS. 4, 6, and 8.

In such an arrangement, the substrate crystal is formed of GaAs, the S (source) - D (drain) structure is formed of GaAs, and the insulator layer in the MIS structure is formed of $Al_xGa_{1-x}As$.

Alternatively, the substrate crystal may be formed of InP, the S (source) - D (drain) structure may be formed of $Ga_xIn_{1-x}As$, and the insulator layer in the MIS structure may be formed of $Al_xIn_{1-x}As$.

Rather than the above combinations of $Al_xGa_{1-x}As$/GaAs and $Al_xIn_{1-x}As$/$Ga_xIn_{1-x}$/As/InP, a heterostructure of $Ga_xIn_{1-x}P$/GaAs, $Ga_xIn_{1-x}As_yP_{1-y}$/InP, $Ga_xIn_{1-x}P$/InP, $Al_xGa_{1-x}P$/GaP, $InAs_ySb_{1-y}$, or the like may be employed as a material combination in a vertical MIS-SIT.

Although certain preferred embodiments of the present invention have been shown and described in detail, it should be understood that various changes and modifications may be made therein without departing from the scope of the appended claims.

What is claimed is:

1. A method of manufacturing a semiconductor device, comprising the steps of:

depositing at least two semiconductor regions of different conductivity types by way of epitaxial growth on a substrate crystal according to either metal organic chemical vapor deposition or molecular layer epitaxy, thereby providing a source-drain structure;

etching said semiconductor regions to form a gate side which comprises either a (111)A face or a (111)B face; and depositing a semiconductor region as a gate by way of epitaxial growth on said gate side according to either metal organic chemical vapor deposition or molecular layer epitaxy.

2. A method according to claim 1, wherein said substrate crystal is highly doped with impurities and used as either a source or a drain of the source-drain structure, further including the step of:

depositing an insulating layer by way of epitaxial growth between an electrode which serves as said gate and said source region according to either metal organic chemical vapor deposition or molecular layer epitaxy.

3. A method according to claim 1, wherein said substrate crystal comprises a semi-insulating substrate crystal, further including the step of:

exposing a semiconductor layer which is highly doped with impurities for use as a source region of the source-drain structure.

4. A method according to any one of claims 1 through 3, wherein said substrate crystal comprises either one of a (111)A face, a (111)B face, and a (110) face.

* * * * *